(12) United States Patent
Lee et al.

(10) Patent No.: US 7,348,200 B2
(45) Date of Patent: Mar. 25, 2008

(54) METHOD OF GROWING NON-POLAR A-PLANE GALLIUM NITRIDE

(75) Inventors: Soo Min Lee, Seoul (KR); Rak Jun Choi, Tokushima (JP); Naoi Yoshiki, Tokushima (JP); Sakai Shiro, Tokushima (JP); Masayoshi Koike, Kyungki-do (KR)

(73) Assignees: Samsung Electro-Mechanics Co. Ltd., Suwon, Kyungki-Do (KR); The University of Tokushima, Tokushima (JP)

( * ) Notice: Subject to any disclaimer, the term of this patent is extended or adjusted under 35 U.S.C. 154(b) by 41 days.

(21) Appl. No.: 11/368,184

(22) Filed: Mar. 3, 2006

(65) Prior Publication Data

US 2006/0216914 A1   Sep. 28, 2006

(30) Foreign Application Priority Data

Mar. 25, 2005   (KR) ...................... 10-2005-0025184

(51) Int. Cl.
*H01L 21/00* (2006.01)

(52) U.S. Cl. ................... 438/46; 257/E33.023; 257/78; 257/187; 257/615

(58) Field of Classification Search ................ 438/22, 438/46, 78, 187, 615; 257/E33.023
See application file for complete search history.

(56) References Cited

U.S. PATENT DOCUMENTS

2003/0198837 A1*  10/2003  Craven et al. .............. 428/698

FOREIGN PATENT DOCUMENTS

JP          11068159 A   *   3/1999

OTHER PUBLICATIONS

O. Briot et al., Influence of the V/III Molar Ration on the Structural and Electronic Properties of MOVPE Grown GaN, 1997, Solid-State Eletronics vol. 41. No. 2, pp. 315-317.*

D. Li et al., Growth of a_Plane GaN Films on r-Plane Sapphire Substrates by Metalorganic Chemical Vapour Deposition, 2004, Chin. Phys. Lett., vol. 21, No. 5, pp. 970-971.*

* cited by examiner

*Primary Examiner*—Brook Kebede
*Assistant Examiner*—Phillip S Green
(74) *Attorney, Agent, or Firm*—Volpe and Koenig P.C.

(57) ABSTRACT

The invention provides a method of growing a non-polar a-plane gallium nitride. In the method, first, an r-plane substrate is prepared. Then, a low-temperature nitride-based nucleation layer is deposited on the substrate. Finally, the non-polar a-plane gallium nitride is grown on the nucleation layer. In growing the non-polar a-plane gallium nitride, a gallium source is supplied at a flow rate of about 190 to 390 μmol/min and the flow rate of a nitrogen source is set to produce a V/III ratio of about 770 to 2310.

12 Claims, 6 Drawing Sheets

(a)
NH₃=1.0 SLM V/III=177

(b)
NH₃=5.0 SLM V/III=885

(c)
NH₃=10.0 SLM V/III=1770

(d)
NH₃=15.4 SLM V/III=3951

METHOD OF GROWING NON-POLAR A-PLANE GALLIUM NITRIDE

CLAIM OF PRIORITY

This application claims the benefit of Korean Patent Application No. 2005-25184 filed on Mar. 25, 2005, in the Korean Intellectual Property Office, the disclosure of which is incorporated herein by reference.

BACKGROUND OF THE INVENTION

1. Field of the Invention

The present invention relates to a method of growing a non-polar a-plane gallium nitride. More particularly, the present invention relates to a method of growing a non-polar a-plane gallium nitride single crystal using an MOCVD technique.

2. Description of the Related Art

In general, a gallium nitride single crystal is grown via a vapor phase growth method such as metal organic chemical vapor deposition (MOCVD) and hydride vapor phase epitaxy (HVPE), or a molecular beam epitaxy (MBE) method on a heterogeneous substrate such as sapphire ($Al_2O_3$) or silicon. In practice, the gallium nitride single crystal employed in the fabrication of a gallium nitride light-emitting device is grown along a c-axis direction [0001].

However, due to strong piezoelectric properties manifested in the c-axis direction, a piezoelectric field arises from stress at interfaces having different lattice constants. As shown in FIG. 1a, in a band diagram of an idealistic active layer free from stress, wave functions of electrons and holes are almost symmetrical. But as shown in FIGS. 1b and 1c, in case of influence of compressive stress or tensile stress resulting from different lattice constants, the piezoelectric field separates the wave functions of electrons and holes from each other as marked by a dotted line. This disadvantageously degrades recombination efficiency in an active layer of a gallium nitride device grown in the c-axis direction of the substrate. Further, an increased distance between the wave functions caused by such piezoelectric field tends to lengthen a light-emitting wavelength and potentially alter the light-emitting wavelength depending on the extent of voltage applied.

To solve these problems, U.S Patent Publication No. 2003/0198837 (published on Oct. 23, 2003, invented by Michael D. Craven et al.) teaches a method of growing a non-polar a-plane gallium nitride. It was confirmed that as a result of a test conducted based on the aforesaid method, the gallium nitride grew slowly. More specifically, as disclosed in the U.S. patent, the gallium nitride grew at a rate of merely 5 to 9 Å/s (1.8 to 3.24 μm/hr).

Moreover, as described in the U.S. Patent, it was confirmed that the non-polar a-plane gallium nitride could grow under a pressure of 0.2 atm or less. As is easily understood by those skilled in the art, this low-pressure condition for growth has a limit in obtaining a high-quality crystalinity. Also, before growing the non-polar a-plane gallium nitride, the pressure condition (typically 1 atm) for depositing a low-temperature nucleation layer should be changed to a low pressure condition for growing the gallium nitride. This disadvantageously complicates a process.

SUMMARY OF THE INVENTION

The present invention has been made to solve the foregoing problems of the prior art and it is therefore an object of the present invention to provide a method of growing a novel non-polar a-plane gallium nitride which ensures growth at a faster rate and under a relatively higher pressure (preferably atmospheric pressure).

According to an aspect of the invention for realizing the object, there is provided a method of growing a non-polar a-plane gallium nitride comprising steps of:

(a) preparing an r-plane substrate;

(b) depositing a low-temperature nitride-based nucleation layer on the substrate; and (c) growing the non-polar a-plane gallium nitride on the nucleation layer, wherein the growing step (c) is carried out under the condition that a gallium source is supplied at a flow rate of about 190 μmol/min to about 390 μmol/min and the flow rate of a nitrogen source is set to produce a V/III ratio of about 770 to 2310.

The nitrogen source supplied in the growing step (c) may be in the range of about 3.5 slm to about 20 slm. Preferably, for higher crystalinity, the V/III ratio in the growing step (c) may be 1850 or less, that is, about 770 to 1850.

Preferably, the substrate comprises the r-plane sapphire substrate but not limited thereto. The substrate may comprise one selected from a group consisting of sapphire, silicon carbide, gallium nitride and zinc oxide.

Preferably, an in-plane orientation of the gallium nitride with respect to the r-plane substrate is $[0001]_{GaN}\|[\bar{1}101]_{Sapphire}$ and $[\bar{1}100]_{GaN}\|[11\bar{2}0]_{Sapphire}$.

The nitride nucleation layer may have a composition expressed by $Al_xGa_yIn_{1-x-y}N$, where $0 \leq x \leq 1$ and $0 \leq y \leq 1$. The depositing step (b) may be carried out at a temperature of about 400° C. to about 900° C.

The depositing step (b) is carried out at a temperature of about 900° C. to about 1200° C. and under a pressure of about 0.2 atm to about 1.2 atm. More preferably, the pressure for growing the gallium nitride is in the range of about 0.5 atm to about 1 atm, and most preferably about 1 atm.

Further, the pressure for growing the gallium nitride is substantially identical to that for depositing the nitride nucleation layer. This obviates a need to alter the pressure during a process.

According to the invention, the gallium nitride is grown at a rate of at least 3.5 μm/hr. Also, the gallium nitride grows at a rate of about 6 μm/hr under a desirable condition of source supply (e.g. about 200 μmol/min gallium source is supplied) and about at a rate of 12 μm/hr depending on a source flow rate.

A chief characteristic of the invention is that the flow rate of nitrogen and gallium sources can be adjusted in a proper range to grow a high-quality non-polar ($11\bar{2}0$) a-plane gallium nitride on an ($1\bar{1}02$) r-plane substrate under a higher pressure. Further, advantageously, the invention allows the high-quality non-polar ($11\bar{2}0$) a-plane gallium nitride to grow 30% faster (up to 4 times) than a conventional method.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF THE PREFERRED EMBODIMENT

Figure 1:
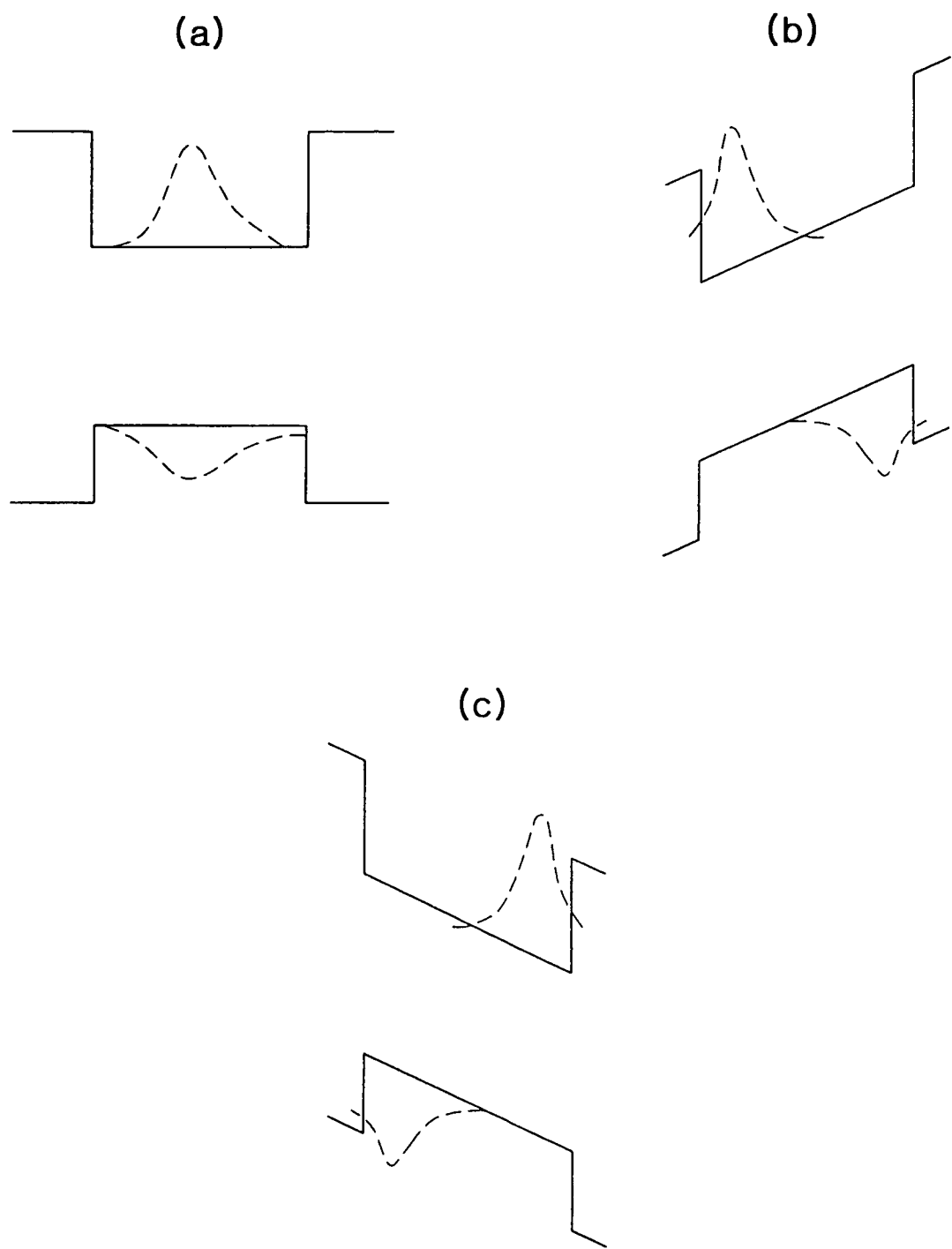
FIGS. 1a to 1c are graphs illustrating an energy band diagram of an active layer and wave functions of electrons and holes to explain influence of a piezoelectric field.
Figure 2:
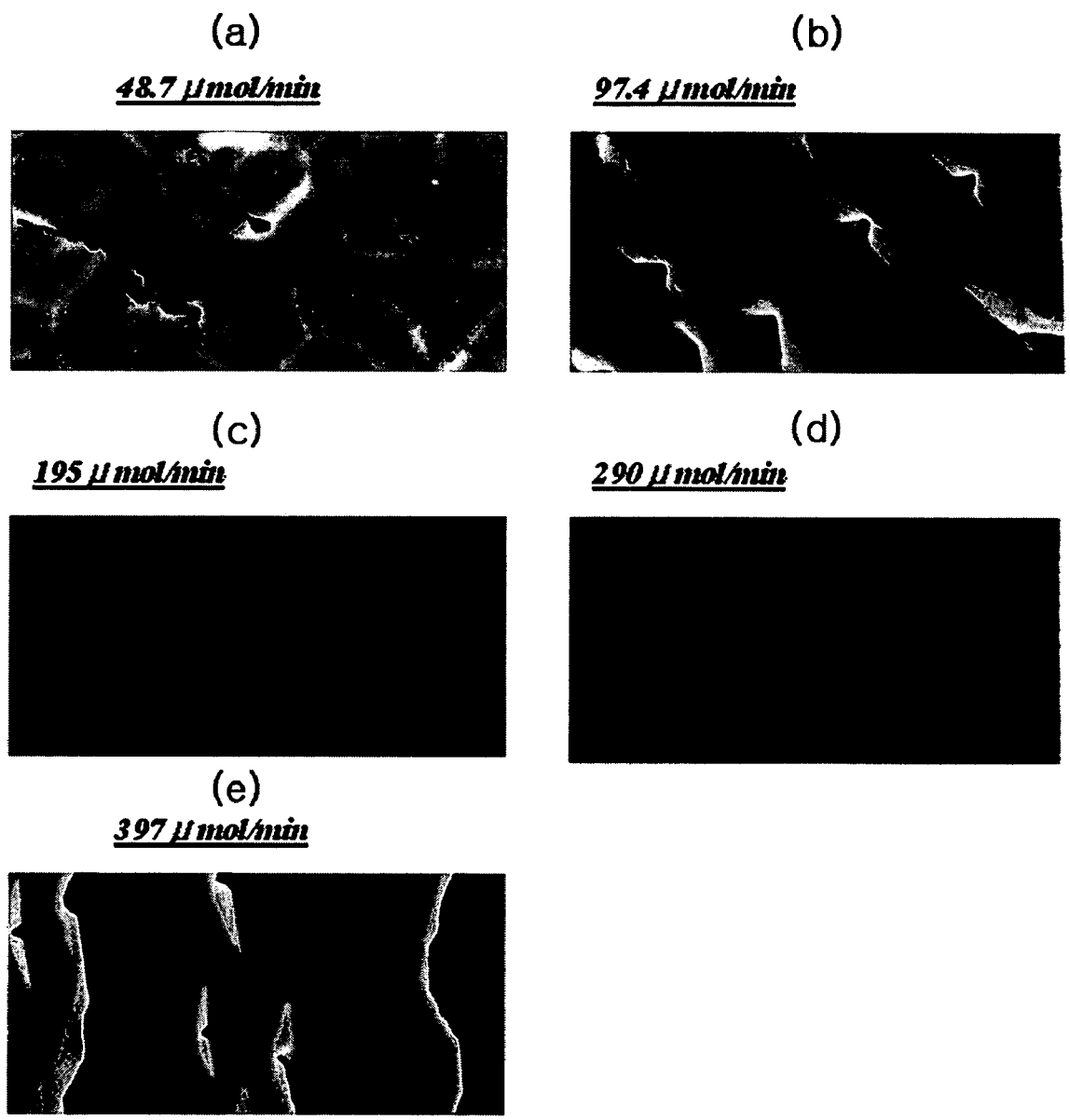
FIGS. 2a to 2e are SEM pictures illustrating surfaces of gallium nitrides obtained according to a first embodiment of the invention for explaining a flow rate of a gallium source.
Figure 3:
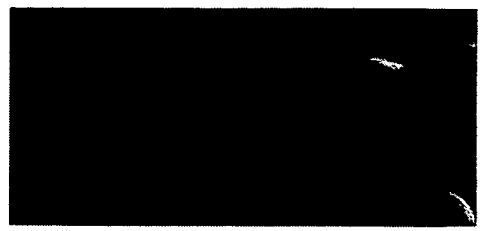
FIGS. 3a to 3d are SEM pictures illustrating surfaces of gallium nitrides obtained according to a second embodiment of the invention for explaining a flow rate of a nitrogen source.
Figure 3:
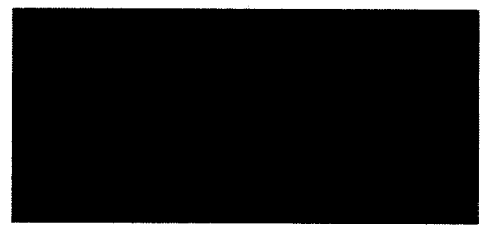
Figure 3:
Figure 3:

Preferred embodiments of the present invention will now be described in detail with reference to the accompanying drawings. An explanation will be given regarding a condition for growing a non-polar ($11\bar{2}0$) a-plane gallium nitride.

EXAMPLE 1

This experiment was conducted to set an appropriate flow rate of a group III gallium source to obtain a non-polar a-plane gallium nitride having a superior crystalinity.

First, an ($1\bar{1}02$) r-plane sapphire substrate was loaded into a metal organic chemical vapor deposition (MOCVD) equipment. The sapphire substrate was annealed at a temperature of 1150° C. under hydrogen atmosphere. Then a low-temperature AlInN nucleation layer was grown to a thickness of 20 nm at a high temperature of 850° C. and under pressure of about 1 atm. At this time, 43 sccm of TMAl(trimethyl-aluminum), 300 sccm of TMIn (trimethyl-indium), and about 1 slm of $NH_3$ were supplied, respectively.

Thereafter, through an MOCVD process in which other conditions were equal except for the flow rate of gallium source or TMGa(trimethyl-gallium), a non-polar ($11\bar{2}0$) a-plane gallium nitride was grown to a thickness of about 7 to 8 μm on the low-temperature AlInN nucleation layer for about 50 minutes. More specifically, pressure and temperature were set at about 1 atm, and about 1100° C., respectively. $NH_3$ was supplied at the flow rate of about 10 slm, while TMGa was supplied at different rates of 48.7, 97.4, 195, 290, 397 μmol/min to grow 5 galium nitrides. Surfaces of gallium nitrides grown with TMGa supplied at different rates were photographed by SEM as in FIGS. 2a to 2e.

In case where the flow rate of TMGa was 48.7 μmol/min, and 97.4 μmol/min, respectively (refer to FIGS. 2a and 2b), the surfaces of gallium nitrides were found to be very rough but TMGa supplied at the flow rate of above 190 μmol/min began to produce a mirror surface. That is, in case where TMGa was supplied at the rate of 195 μmol/min and 290 μmol/min, respectively (refer to FIGS. 2c and 2d), a mirror surface ensuring high crystallinity was obtained. Meanwhile, in case where TMGa was supplied at the rate of 397 μmol/min, in excess of 390 μmol/min (refer to FIG. 2e), the surfaces of gallium nitride were somewhat differently patterned but significantly rough.

Through this example, a preferable flow rate of a gallium source was set at about 190 to 390 μmol/min to produce a high-quality non-polar a-plane gallium nitride.

EXAMPLE 2

This experiment was conducted to set an appropriate flow rate of a group V nitrogen source to obtain a non-polar a-plane gallium nitride having a superior crystalinity.

This example was performed for about 50 minutes under conditions equal to those of Example 1. But in growing the non-polar a-plane gallium nitride, $NH_3$ and TMGa were supplied at different rates. With respect to a source flow rate for the growth of the gallium nitride, TMGa was supplied at the flow rate of about 290 μmol/min and $NH_3$ was supplied at different rates of 1.0, 5.0, 10.0, 15.4 slm. Surfaces of 4 galium nitrides grown with $NH_3$ supplied at different rates were photographed by SEM as shown in FIGS. 3a to 3d.

In case where $NH_3$ was supplied at the rate of 1.0 μm, (refer to FIG. 3a), a surface of gallium nitride was found to be very rough. But $NH_3$ supplied at the rate of 5.0 and 10.0 slm of $NH_3$, respectively, (refer to FIGS. 3b and 3c) led to the gallium nitrides having a good mirror surface. Meanwhile, $NH_3$ supplied at the rate exceeding 15 slm (refer to FIG. 3d, 15.4 slm) resulted in significant roughness on the surface of the gallium nitride.

Through this example, with TMGa supplied at the rate of about 290 μmol/min, a preferable flow rate of a nitrogen source was set at about 5 to 15 slm to produce a high-quality non-polar a-plane gallium nitride. However, since this example has been carried out under a specific condition for a gallium source flow rate, V/III ratio can be derived to determine a flow rate of the nitrogen source irrelevant to a specified flow rate of the gallium source.

The V/III ratio obtained in this example is about 770 to 2310. Based on the V/III ratio and TMGa flow rate obtained in Example 1, the nitrogen source flow rate of the invention can be set to be about 3.5 to 20 slm.

Examples 1 and 2 as described above confirmed that the non-polar a-plane gallium nitride could grow under an atmospheric pressure, that is, 1 atm. The conventional technique of growing a nitride under a lower pressure (about 0.2 atm) via MOCVD hardly ensures superior crystality but the invention allows a high-quality non-polar a-plane gallium nitride due to its growth under 1 atm pressure. Such pressure condition may be varied within a range of about 0.2 to 1.2 atm if necessary. The pressure is set more preferably at about 0.5 to 1 atm, and most preferably at about 1 atm. Also, by equating pressure (about 1 atm) for growing the gallium nitride with that for depositing a low-temperature nucleation layer, a pressure-setting or pressure-changing process can be omitted.

EXAMPLE 3

Figure 4:
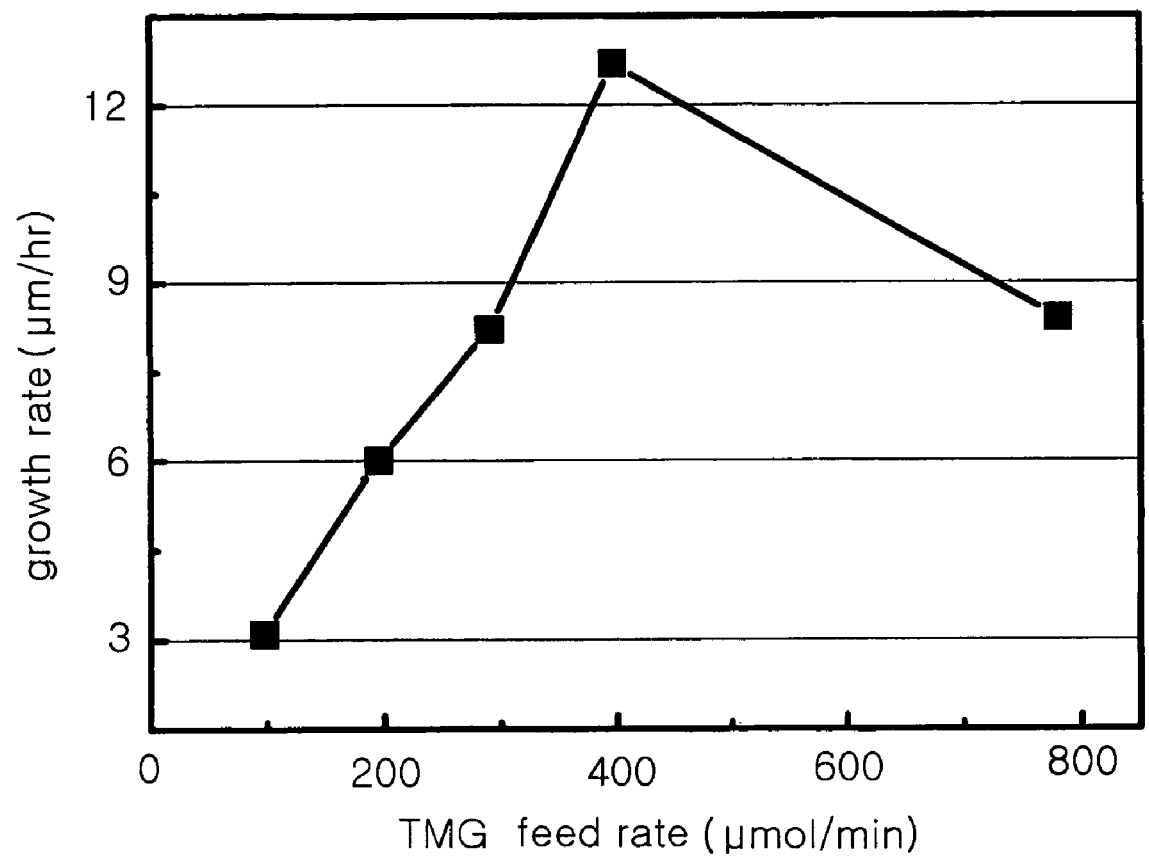
FIG. 4 is a graph illustrating a change in a growth rate of gallium nitride in accordance with a change in the flow rate of the gallium source.

This experiment was carried out under conditions equal to those of Example 1. That is, under equal conditions, a sapphire substrate was annealed to grow a low-temperature AlInN buffer layer. Then a non-polar a-plane gallium nitride was grown. Here, a flow rate of $NH_3$ was maintained constant (about 10 slm) and that of TMGa was varied to measure a growth rate in accordance with a change in the TMGa flow rate (about 100 to 780 μmol/min). FIG. 4 is a graph illustrating the result.

Referring to FIG. 4, when a gallium source is supplied within the range of about 190 to 390 μmol/min according to the invention, the gallium nitride was found to grow at a rate of at least 5.7 μm/hr and further at a high rate of 12.5 μm/hr. Even though the result may vary according to differences in conditions such as pressure, the growth rate according to the invention was at least about 3.5 μm/hr. This growth rate is a considerable improvement from that (about 1.8 to 3.24 µm/hr) obtained via a conventional technique.

EXAMPLE 4

Figure 5:
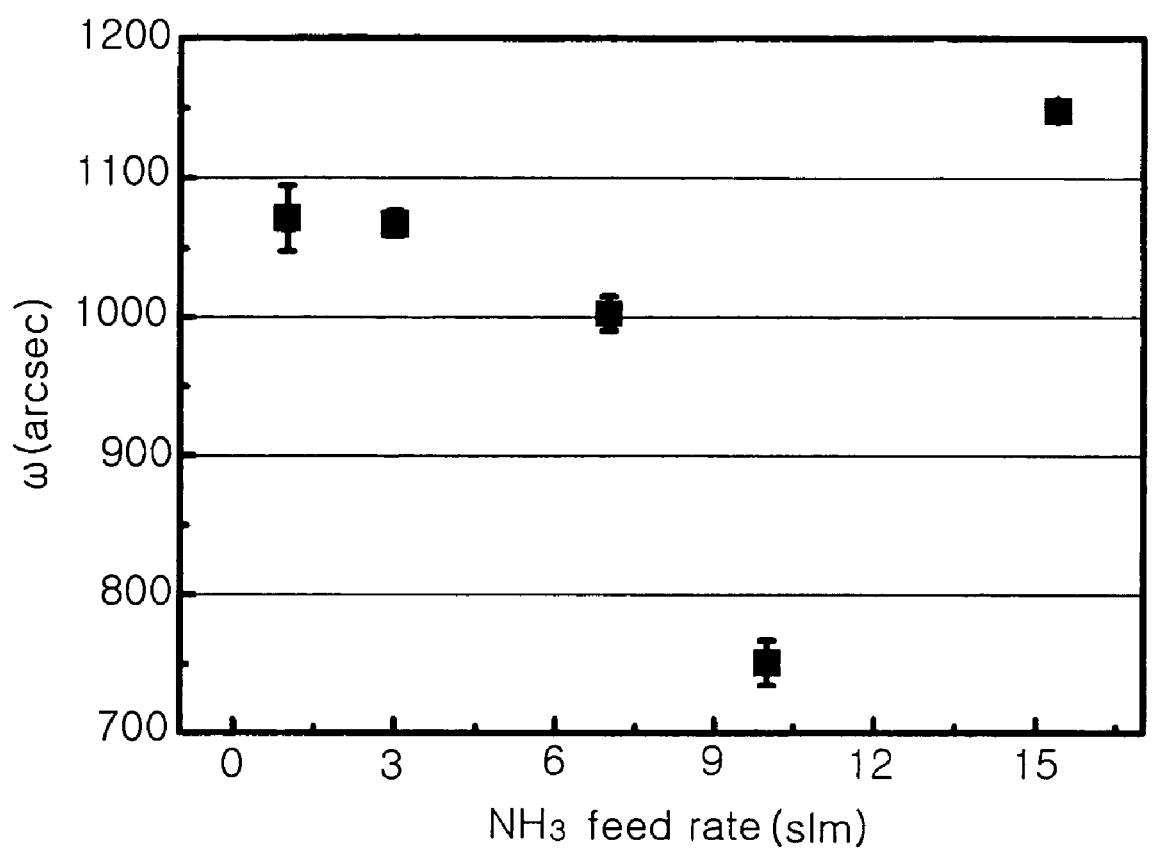
FIG. 5 is a graph for explaining influence of the flow rate of the nitrogen source on crystalinity of gallium nitride.

This experiment was carried out under conditions equal to those of example 2. That is, under equal conditions, a sapphire substrate was annealed to grow a low-temperature AlInN-based nucleation layer. Then, non-polar a-plane gallium nitrides were grown. Here, a flow rate of TMGa was maintained constant (about 290 µmol/min) and that of $NH_3$ was varied. Thereafter, it was confirmed what effects such variation (about 1.2 to 15.4 slm) in the $NH_3$ flow rate within a certain range had on crystalinity. That is, a ω rocking mode with respect to a crystal surface (11$\bar{2}$0) of gallium nitrides was obtained via x-ray. FIG. 5 is a graph illustrating the result.

Referring to FIG. 5, when a nitrogen source is supplied within the range (about 5 to 15 slim in the case of 290 µmol/min TMGa) of the invention, crystality was 1150" or less. Especially when a $NH_3$ source was supplied within the range of about 5 to 12 slm, a-plane crystalinity was superior with 1000" or less, and 750" (about 10 slm) at the lowest. An adequate V/III ratio with crystalinity considered can be set to be about 770 to 1850.

In this case, an in-plane orientation of the gallium nitride with respect to the r-plane substrate is $[0001]_{GaN}\|[\bar{1}101]_{Sapphire}$ and $[\bar{1}100]_{GaN}\|[11\bar{2}0]_{Sapphire}$.

Figure 6:
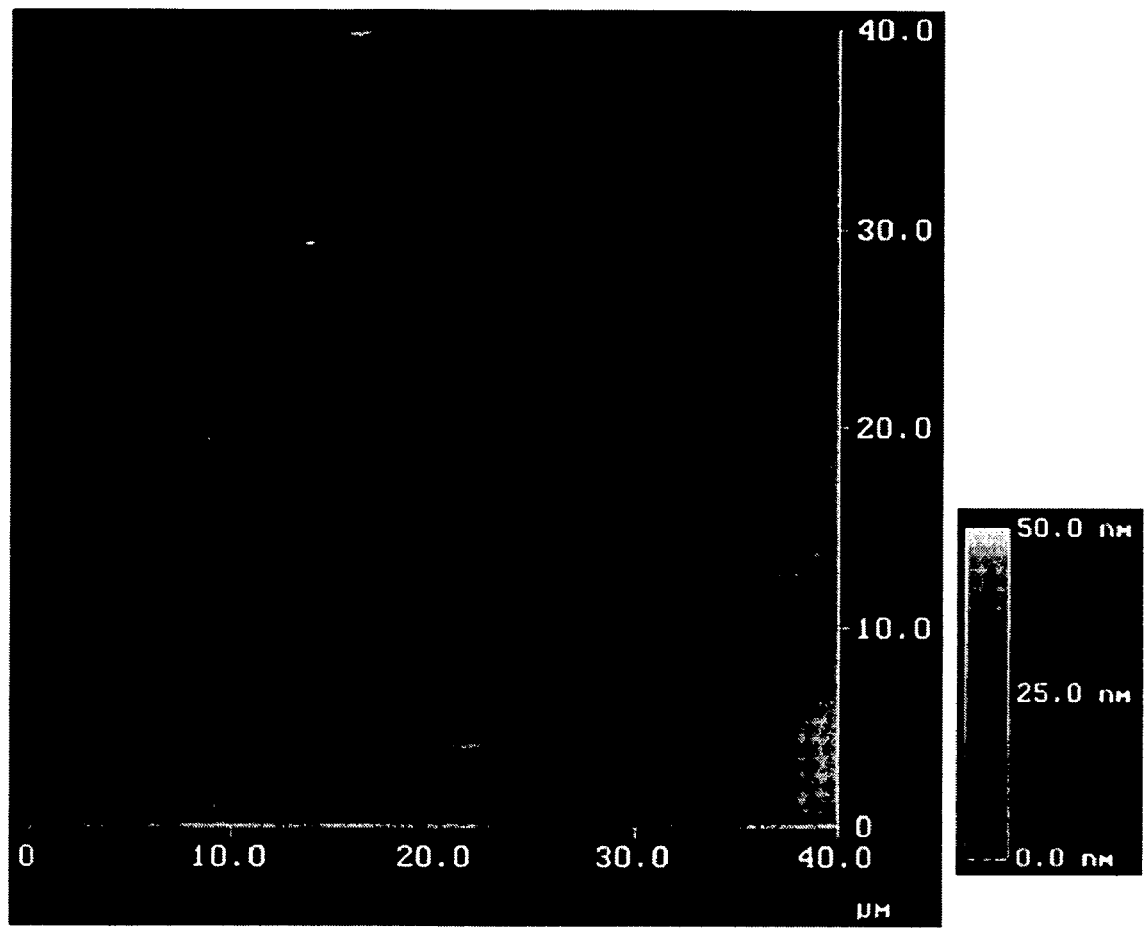
FIG. 6 is an SEM picture for identifying surface conditions of gallium nitride of FIG. 2d.

FIG. 6 is an AFM picture illustrating a surface of a gallium nitride obtained according to one example (FIG. 2d) of the invention. The gallium nitride of FIG. 6 was obtained by supplying TMGa at the rate of 290 µmol/min and corresponds to FIG. 2d.

The gallium nitride of FIG. 6 exhibited an RMS surface roughness of about 1.64 nm and a surface pit density of about $7.6 \times 10^8/cm^2$. A non-polar a-plane gallium nitride obtained according to the invention demonstrated a relatively good crystalinity.

In the examples as described above, the substrate adopted was the sapphire substrate but not limited thereto. For example, a substrate for the growth of a gallium nitride, which has a crystalline structure similar to the sapphire substrate, such as silicon carbide, gallium nitride or zinc oxide may be employed. Also, the (Al, In)N nucleation layer was employed as the nitride nucleation layer, but as is easily understood by those skilled in the art, a nitride layer having a composition expressed by $Al_xGa_yIn_{1-x-y}N$, where $0 \leq x \leq 1$, $0 \leq y \leq 1$, may be suitably adopted.

As set forth above, according to the invention, the flow rate of nitrogen and gallium sources can be adjusted in a proper range to grow a high-quality non-polar (11$\bar{2}$0) a-plane gallium nitride on an (1$\bar{1}$02) r-plane substrate even under an atmospheric pressure. In addition, the invention allows a high-quality non-polar (11$\bar{2}$0) a-plane gallium nitride to grow 30% faster (e.g. 4 times) than a conventional method.

While the present invention has been shown and described in connection with the preferred embodiments, it will be apparent to those skilled in the art that modifications and variations can be made without departing from the spirit and scope of the invention as defined by the appended claims.

What is claimed is:

1. A method of growing a non-polar a-plane gallium nitride comprising steps of:
    (a) preparing an r-plane substrate;
    (b) depositing a low-temperature nitride-based nucleation layer on the substrate; and
    (c) growing the non-polar a-plane gallium nitride on the nucleation layer,
    wherein the growing step (c) is carried out under the condition that a gallium source is supplied at a flow rate of about 190 µmol/min to about 390 µmol/min and the flow rate of a nitrogen source is set to produce a V/III ratio of about 770 to 2310,
    wherein the pressure for growing the gallium nitride is about 0.5 atm or higher.

2. The method according to claim 1, wherein the flow rate of the nitrogen source supplied in the growing step (c) is in the range of about 3.5 slm to about 20 slm.

3. The method according to claim 1, wherein the V/III ratio in the growing step (c) is 1850 or less.

4. The method according to claim 1, wherein the substrate comprises one selected from a group consisting of sapphire, silicon carbide, gallium nitride and zinc oxide.

5. The method according to claim 1, wherein the substrate comprises an r-plate sapphire substrate.

6. The method according to claim 1, wherein an in-plane orientation of the gallium nitride with respect to the r-plane substrate is $[0001]_{GaN}\|[\bar{1}101]_{Sapphire}$ and $[\bar{1}101]_{GaN}\|[11\bar{2}0]_{Sapphire}$.

7. The method according to claim 1, wherein the nitride nucleation layer has a composition expressed by $Al_xGa_yIn_{1-x-y}N$, where $0 \leq x \leq 1$ and $0 \leq y \leq 1$.

8. The method according to claim 1, wherein the depositing step (b) is carried out at a temperature of about 400° C. to about 900° C.

9. The method according to claim 1, wherein the depositing step (b) is carried out at a temperature of about 900° C. to about 1200° C. and under a pressure of about 1.2 atm or less.

10. The method according to claim 9, wherein the pressure for growing the gallium nitride is about 1 atm or less.

11. The method according to claim 9, wherein the pressure for growing the gallium nitride is substantially identical to that for depositing the nitride nucleation layer.

12. The method according to claim 1, wherein the gallium nitride is grown at a rate of at least 3.5 µm/hr.

* * * * *